United States Patent
Xu et al.

(10) Patent No.: US 11,094,534 B2
(45) Date of Patent: Aug. 17, 2021

(54) SURFACE OXIDATION METHOD FOR WAFER

(71) Applicant: Shanghai Simgui Technology Co., Ltd., Shanghai (CN)

(72) Inventors: Huijun Xu, Shanghai (CN); Yujia Zhuang, Shanghai (CN); Hao Wang, Shanghai (CN); Xiangyu Li, Shanghai (CN)

(73) Assignee: Shanghai Simgui Technology Co., Ltd., Shanghai (CN)

( * ) Notice: Subject to any disclaimer, the term of this patent is extended or adjusted under 35 U.S.C. 154(b) by 0 days.

(21) Appl. No.: 16/670,551

(22) Filed: Oct. 31, 2019

(65) Prior Publication Data
US 2020/0343086 A1 Oct. 29, 2020

(30) Foreign Application Priority Data

Apr. 25, 2019 (CN) .......................... 201910338529.7

(51) Int. Cl.
*H01L 21/67* (2006.01)
*H01L 21/02* (2006.01)

(52) U.S. Cl.
CPC ...... *H01L 21/0223* (2013.01); *H01L 21/0201* (2013.01); *H01L 21/02337* (2013.01)

(58) Field of Classification Search
None
See application file for complete search history.

(56) References Cited

U.S. PATENT DOCUMENTS

| | | | |
|---|---|---|---|
| 2003/0190496 A1* | 10/2003 | Badowski | C23C 8/02 428/698 |
| 2004/0159284 A1* | 8/2004 | Sakamoto | H01L 21/67259 118/712 |
| 2015/0072273 A1* | 3/2015 | Suzuki | G03F 1/32 430/5 |
| 2016/0244881 A1* | 8/2016 | Takenaga | C23C 16/52 |
| 2016/0372363 A1* | 12/2016 | Aga | H01L 21/324 |
| 2020/0168501 A1* | 5/2020 | Wei | H01L 21/3065 |

\* cited by examiner

*Primary Examiner* — Benjamin P Sandvik
(74) *Attorney, Agent, or Firm* — Arch & Lake LLP

(57) ABSTRACT

A surface oxidation method for a wafer, the method comprises: raising a temperature on the wafer in an oxidation atmosphere, the temperature is raised from a start temperature to a target temperature at a temperature raising rate greater than 5° C./min, the temperature is raised in a vertical furnace tube of an annealing furnace, the vertical furnace tube includes a gas intake conduit arranged on a side wall, the gas intake conduit includes a gas inlet arranged to be proximate to a bottom of the vertical furnace tube and a gas outlet arranged to be proximate to a top of the furnace tube, the wafer overlying the vertical furnace tube; and isothermally oxidizing the wafer at the target temperature in the oxidation atmosphere.

5 Claims, 14 Drawing Sheets

Raising a temperature on a wafer in an oxidation atmosphere from a start temperature to a target temperature at a temperature raising rate greater than 5°C /min; a first oxidation layer is formed on a surface of the wafer, and the formed first oxidation layer has a thickness that is greater at a center than at an edge — S31

Isothermally oxidizing the wafer at the target temperature in the oxidation atmosphere; a second oxidation layer is further formed on the surface of the wafer, and the formed second oxidation layer has a thickness that is greater at a center than at an edge — S32

FIG. 3

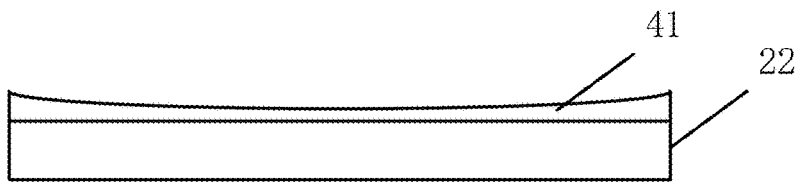

FIG. 4A

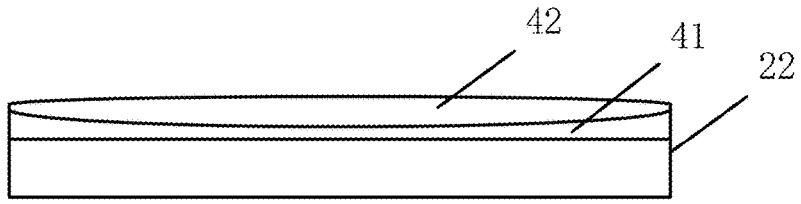

FIG. 4B

SURFACE OXIDATION METHOD FOR WAFER

CROSS-REFERENCE TO RELATED APPLICATION

This application is based upon and claims priority to Chinese Patent Application No. 201910338529.7, filed on Apr. 25, 2019, the entire contents thereof are incorporated herein by reference.

TECHNICAL FIELD

The present disclosure relates to the technical field of semiconductor material manufacturing, and in particular, relates to a surface oxidation method for a wafer.

BACKGROUND

A thermal oxidation layer on a silicon sheet is generally used in the process fields of an insulating layer of a semiconductor device, a sacrificing layer for photolithography, a buried oxide layer of a silicon-on-insulator (SOI) and the like semiconductor materials. With respect to a vertical furnace, a typical thermal oxidation method for the silicon sheet includes: in an initial state, maintaining a low loading temperature (in the range of from 400° C. to 800° C.) in the furnace tube; placing silicon sheets at the room temperature onto a boat, and raising the temperature and meanwhile injecting an inert gas (Ar or $N_2$); raising the temperature to an oxidation temperature (in the range of from 800° C. to 1100° C.), starting injecting oxygen or a mixture of oxygen and hydrogen, which is a primary oxidation stage; and upon growing of the oxidation layer, ending the oxidation stage, lowering the temperature in the furnace to an unload temperature (in the range of from 400° C. to 800° C.), and like the temperature raising stage, injecting an inert gas (Ar or $N_2$) at this stage. The gas is injected from a gas conduit parallel to the wall of the furnace on an outer side of the furnace, and the gas flows from the bottom to the top and reaches the top of the furnace and enters the furnace via a shower-head-shaped conduit. Since the temperature when the gas is injected is far lower than the process temperature in the furnace, the temperature of the side furnace wall is thus lowered. As a result, the temperature on the silicon chip during this process is not uniform, and thus the oxidation layer has a thickness that is greater at one side and smaller at the other side. FIG. 1 is a schematic diagram of thickness distribution of an oxidation layer formed by using an oxidation method in the related art. From FIG. 1, a gradient distribution of the temperature on the surface of the wafer may be observed.

Therefore, how to regulate the oxidation process of the vertical furnace tube to obtain a more uniform oxidation layer is a problem to be urgently solved by the present disclosure.

SUMMARY

A technical problem to be solved by the present disclosure is to provide a surface oxidation method for a wafer, such that a more uniform oxidation layer may be obtained.

In view of above, the present disclosure provides a surface oxidation method for a wafer, an annealing furnace with a vertical furnace tube, the vertical furnace tube including a gas intake conduit arranged on a side wall, the gas intake conduit including a gas inlet arranged to be proximate to a bottom of the vertical furnace tube and a gas outlet arranged to be proximate to a top of the furnace tube, the wafer overlying the vertical furnace tube; wherein the method includes the following steps: a temperature raising step, wherein this step is performed in an oxidation atmosphere, and temperature is raised from a start temperature to a target temperature at a temperature raising rate greater than 5° C./min, and the wafer is panned to form a first oxidation layer on a surface of the wafer, wherein the formed first oxidation layer has a thickness that is greater at a center than at an edge; and an isothermal oxidation step, wherein this step is performed at the target temperature and the oxidation atmosphere, and the wafer is panned to further form a second oxidation layer on the surface of the wafer, wherein the formed second oxidation layer has a thickness that is greater at a center than at an edge.

With the above technical solution, the thickness of the oxidation layer in the oxidation process of the vertical furnace tube may be symmetrically compensated, such that an oxidation layer having a uniform radial thickness may be obtained.

BRIEF DESCRIPTION OF THE DRAWINGS

FIG. 3 is a schematic diagram of steps of a surface oxidation method for a wafer according to a specific embodiment of the present disclosure;

FIG. 4A to FIG. 4B are schematic process diagrams according to a specific embodiment of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The terminology used in the present disclosure is for the purpose of describing particular embodiments only and is not intended to limit the present disclosure. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to a judgment" depending on the context.

Hereinafter, specific embodiments of a surface oxidation method for a wafer, according to the present disclosure are described in detail with reference to the accompanying drawings.

Figure 1:
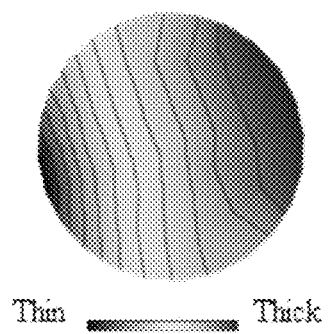
FIG. 1 is a schematic diagram of thickness distribution of an oxidation layer on the surface of a wafer formed by using an oxidation method in the related art.
Figure 2:
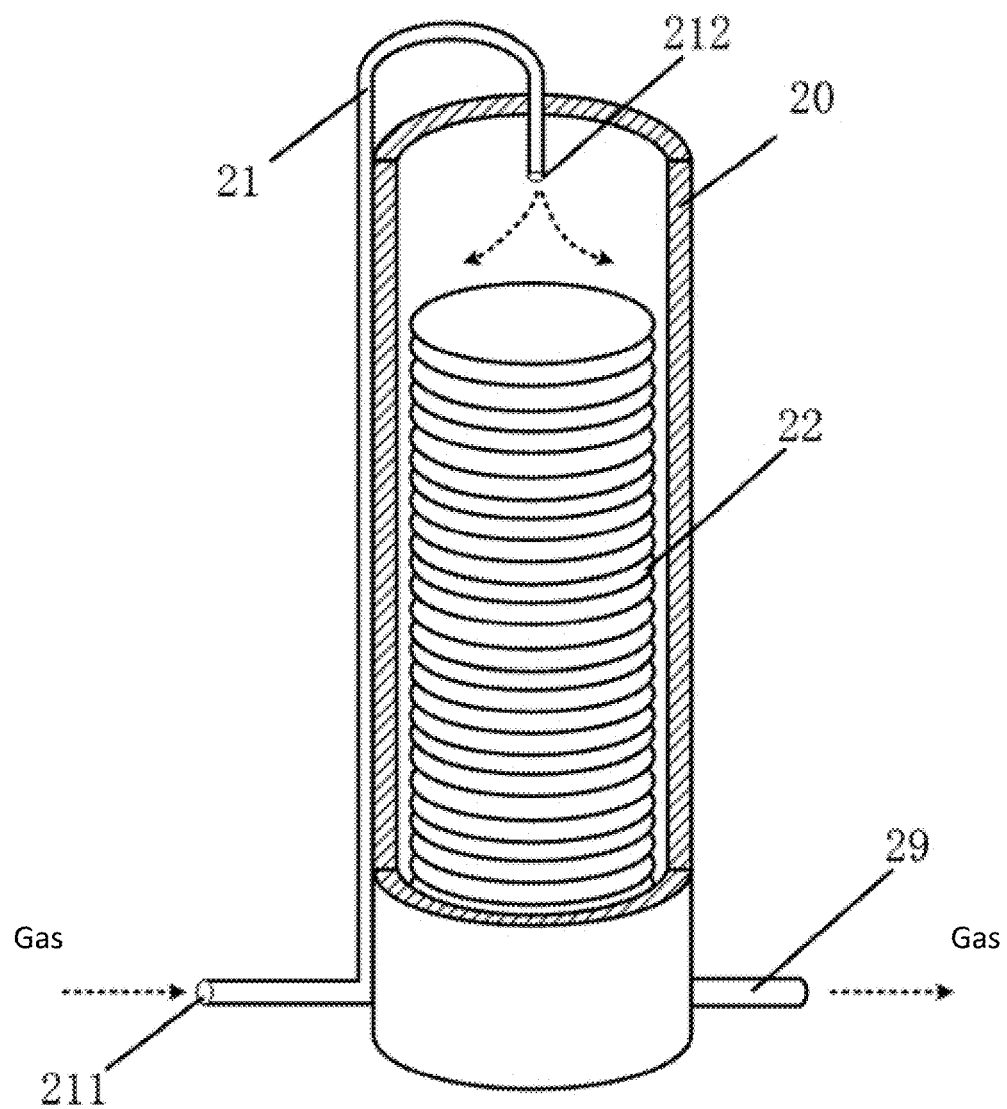
FIG. 2 is a schematic structural diagram of an annealing furnace according to a specific embodiment of the present disclosure.
Figure 5A:
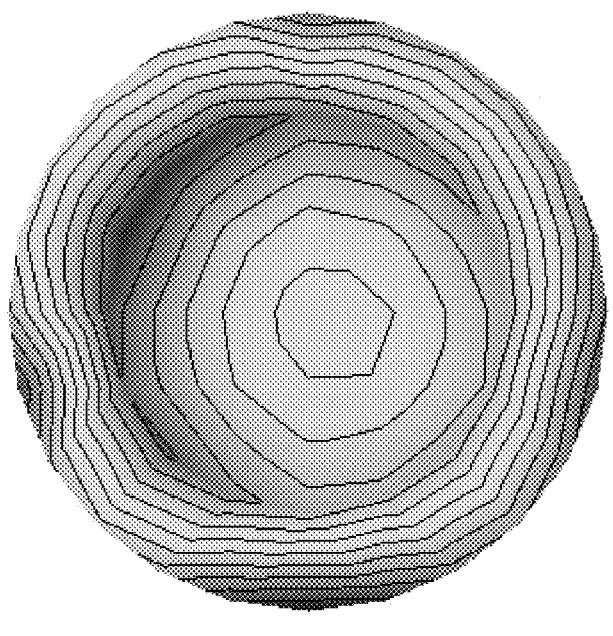
FIGS. 5A to 5E, FIGS. 6A to 6E and FIG. 7 are schematic diagrams of a thickness deviation comparison between two groups of wafers according to a specific embodiment of the present disclosure.
Figure 5B:
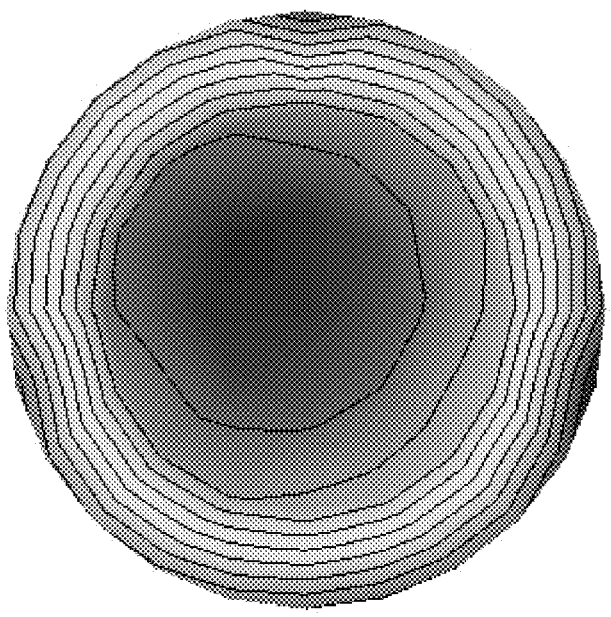
Figure 5C:
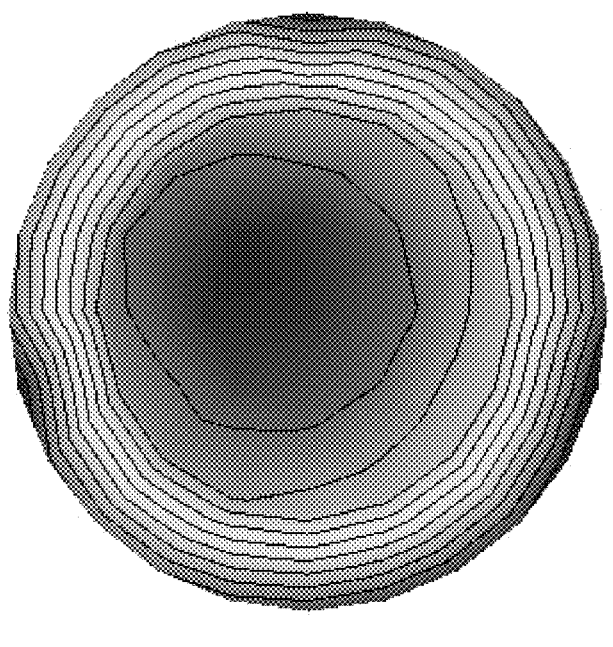
Figure 5D:
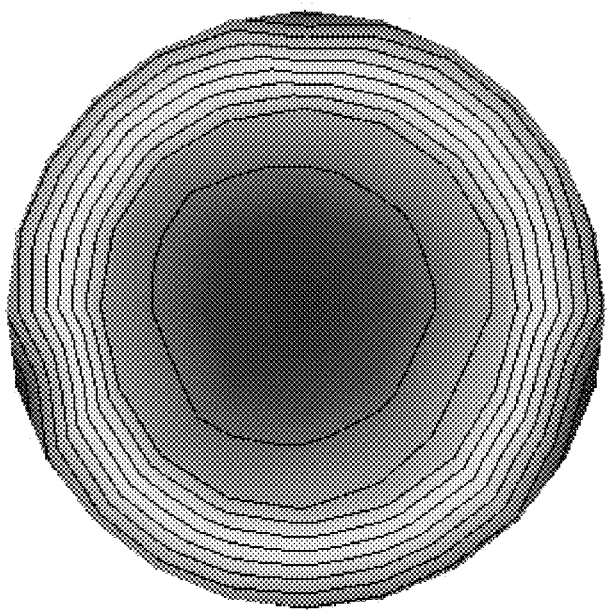
Figure 5E:
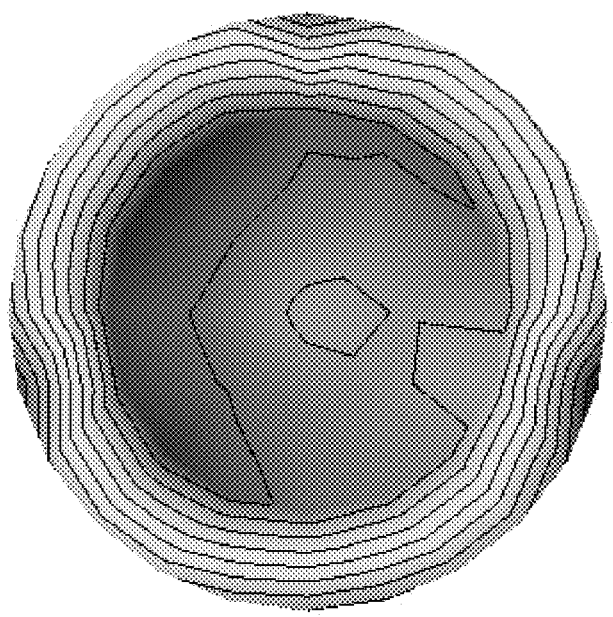

FIG. 2 is a schematic structural diagram of an annealing furnace according to a specific embodiment of the present disclosure. The annealing structure includes a vertical furnace tube 20, wherein the vertical furnace tube 20 includes a gas intake conduit arranged on a side wall. The gas intake conduit 21 includes a gas inlet 211 arranged to be proximate to the bottom of the vertical furnace tube 20, and a gas outlet 212 arranged to be proximate to the top of the vertical furnace tube 20. The wafer 22 overlies the vertical furnace tube 20. The vertical furnace tube 20 further includes a gas discharge port 29, configured to discharge a gas. The furnace is used in the surface oxidation.

FIG. 3 is a schematic diagram of steps in the surface oxidation method for a wafer according to a specific embodiment of the present disclosure. The method, employing the above device, according to this specific embodiment includes the following steps: step S31: a temperature raising step, wherein this step is performed in an oxidation atmosphere, and temperature is raised from a start temperature to a target temperature at a temperature raising rate greater than 5° C./min, and a first oxidation layer is formed on a surface of the wafer, wherein the formed first oxidation layer has a thickness that is greater at a center than at an edge; and step S32: an isothermal oxidation step, wherein this step is performed at the target temperature and the oxidation atmosphere, and a second oxidation layer is further formed on the surface of the wafer, wherein the formed second oxidation layer has a thickness that is greater at a center than at an edge.

FIG. 4A to FIG. 4B are schematic process diagrams of the above method.

As illustrated in FIG. 4A, referring to the temperature raising step in step S31, the temperature raising step is performed in an oxidation atmosphere, and temperature is raised from a start temperature to a target temperature at a temperature raising rate greater than 5° C./min, and a first oxidation layer 41 is formed on a surface of the wafer 22, wherein the formed oxidation layer 41 has a thickness that is greater at a center than at an edge. Optionally, the start temperature is in the range of from 400° C. to 800° C., and the target temperature is in the range of from 800° C. to 1100° C. Prior to this step, a pre-heating step may be performed, such that the temperature and air flow in the vertical furnace 20 are stable. The temperature raising rate in the temperature raising step is in the range of from 10° C./min to 15° C./min, and the temperature raising step is carried out at an atmosphere of hydrogen and oxygen, wherein a volume ratio of hydrogen to oxygen is in the range of from 1:1 to 1.8:1. A gas enters from the gas inlet 211 of the gas intake conduit 21 and enters the vertical furnace tube 20 via the gas outlet 212, and the gas is oxidation-reacted with the surface of the wafer 22 and discharged from the gas discharge port 29. The first oxidation layer 41 formed by oxidation has a thickness that is greater at the center that at the edge for the reason that: the heat source in the temperature raising of the vertical furnace tube 20 is from the outside environment, since the heat is subject to a gradient distribution, the temperature raising rate at the edge of the wafer 22 is higher than that at the center, and at the same moment, the temperature at the edge may be higher than that at the center. Therefore, this oxidation process may cause the thickness of the oxidation layer is greater at the edge than at the center. The temperature raising rate, the ratio of the hydrogen to the oxygen and the flow rate may be adjusted according to the actual conditions. The higher the temperature raising rate, the higher the relative content of the hydrogen and the greater the total flow rate of the hydrogen and the oxygen, and finally the smaller the thickness difference between the edge and the center of the oxidation layer, and vice versa.

As illustrated in FIG. 4B, referring to the isothermal oxidation step in step S32, the isothermal oxidation step is performed at the target temperature and the oxidation atmosphere, and a second oxidation layer 42 is formed on the surface of the wafer, wherein the formed second oxidation layer 42 has a thickness that is greater at a center than at an edge. The isothermal oxidation step is carried out at an atmosphere of hydrogen and oxygen, wherein a volume ratio of hydrogen to oxygen is in the range of from 1:1 to 1.8:1. The first oxidation layer 42 formed by oxidation has a thickness that is greater at the center that at the edge for the reason that: in an isothermal condition of the vertical furnace tube 20, since the gas in the gas intake conduit 21 exerts a cooling effect to the side wall of the conduit, the temperature at the edge of the wafer 22 is lower than that at the center of the wafer 22 at the same moment. Therefore, this oxidation process may cause the thickness of the oxidation layer is thinner at the edge than at the center.

As such, the above two steps may achieve symmetric compensation for the thickness at the center of the oxidation layer, such that an oxidation layer formed by both the first oxidation layer 41 and the second oxidation layer 42 and having good radial thickness uniformity.

Hereinafter, a specific embodiment is described, which includes the following steps:

step 1) placing five wafers to five temperature zones (top, upper middle, middle, lower middle, and bottom parts) on a boat;

step 2) loading the boat to a vertical furnace tube with a standby temperature in the range of from 600° C. to 800° C., raising the temperature to the range of from 800° C. to 1000° C. after the temperature in the furnace becomes stable, injecting 1 to 10 slm of oxygen, pre-oxidizing for 30 s to 5 min;

step 3) starting temperature-raising stage oxidation, raising the temperature at a temperature raising rate of from 10° C./min to 15° C./min, and injecting 1 to 10 slm of hydrogen and 1 to 10 slm of oxygen;

step 4) raising the temperature to a primary oxidation temperature in the range of from 800° C. to 1100° C., injecting 1 to 10 slm of hydrogen and 1 to 10 slm of oxygen, and oxidizing for 40 min to 80 min; and step 5) lowering the temperature to the range of from 600° C. to 800° C., unloading the boat, and taking out the wafers after the boat is cooled.

Figure 6A:
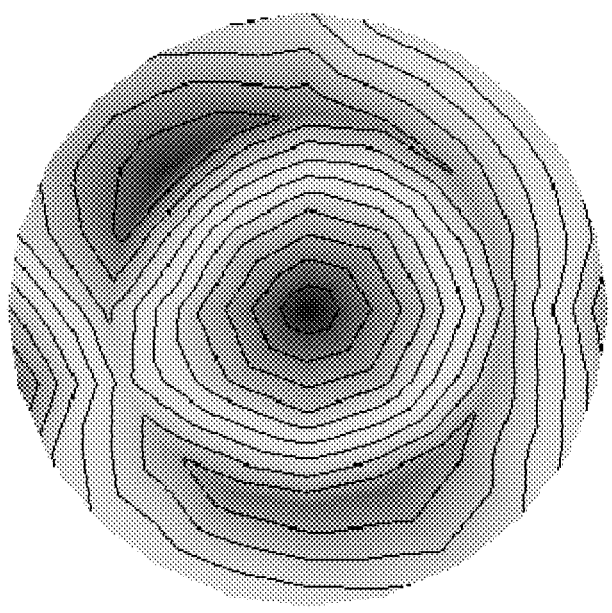
Figure 6B:
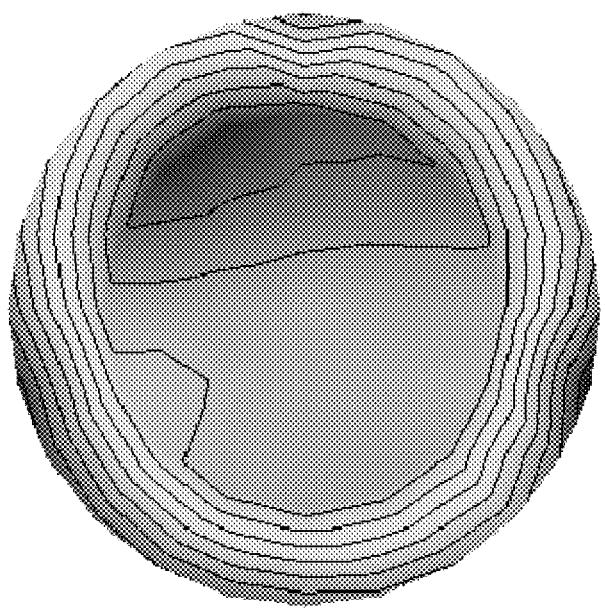
Figure 6C:
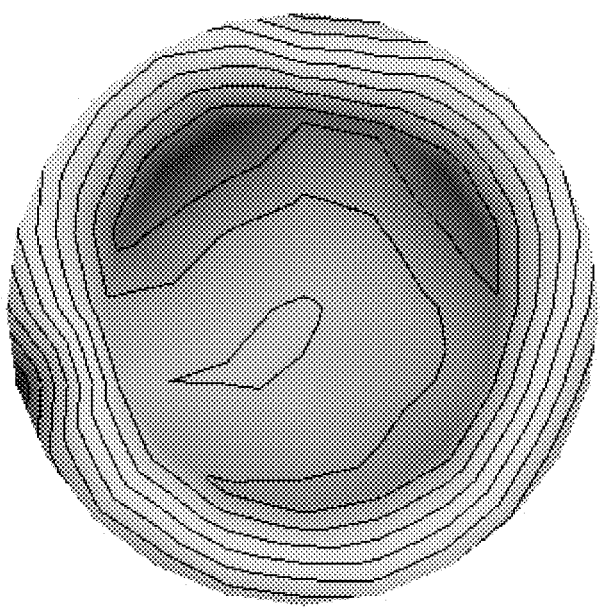
Figure 6D:
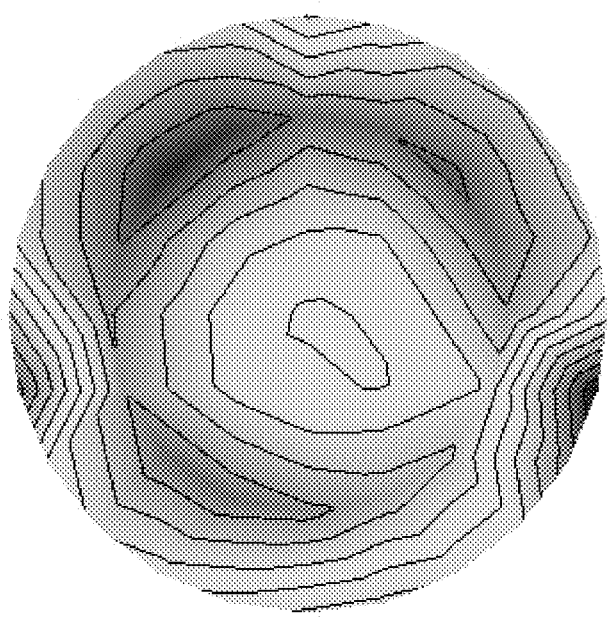
Figure 6E:
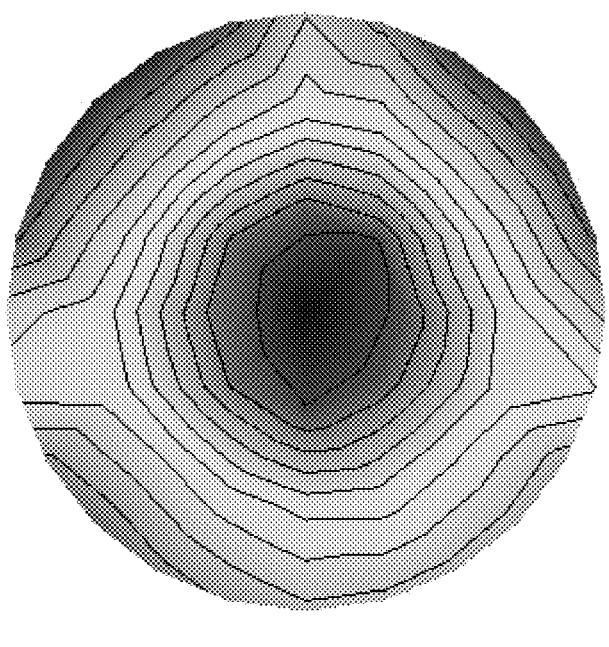

To verify the technical effects of the above embodiments, a process of oxidizing the wafer without carrying out the temperature raising step is particularly performed, that is, step 3) is not performed, and the temperature is directly raised to the primary oxidation temperature after the pre-oxidation. FIG. 5A to FIG. 5E are schematic diagrams of a comparison of thicknesses of the oxidation layers of the five wafers without the temperature raising step. FIG. 6A to FIG.

Figure 7:
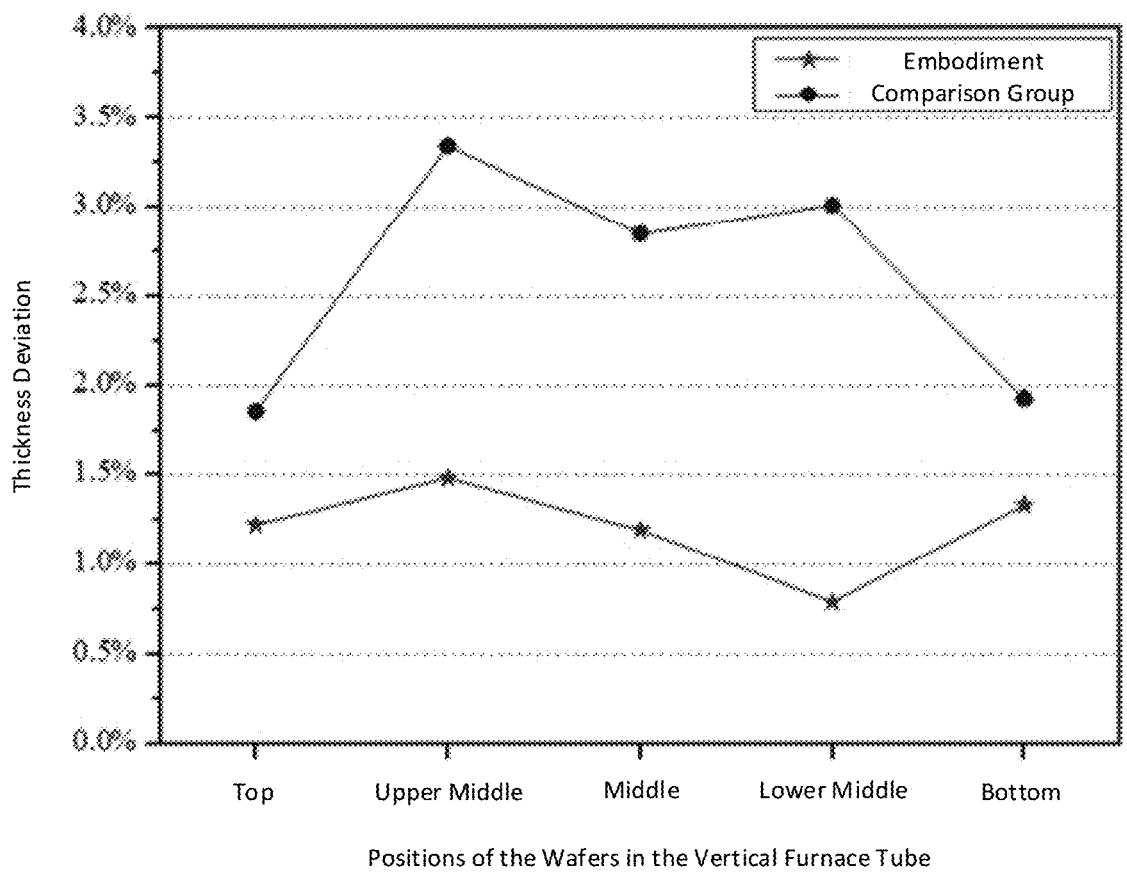

6E are schematic diagrams of thicknesses of the oxidation layers of the five wafers employing the temperature raising step according to the above embodiments. For a visual comparison, FIG. 7 shows a thickness deviation comparison between two groups of wafers in FIGS. 5A to 5E and FIGS. 6A to 6E.

Optionally, the temperature raising rate in the temperature raising step is in the range of from 10° C./min to 15° C./min.

Optionally, the temperature raising step is carried out at an atmosphere of hydrogen and oxygen, wherein a volume ratio of hydrogen to oxygen is in the range of from 1:1 to 1.8:1.

Optionally, the isothermal oxidation step is carried out at an atmosphere of hydrogen and oxygen, wherein a volume ratio of hydrogen to oxygen is in the range of from 1:1 to 1.8:1.

Optionally, the start temperature is in the range of from 400° C. to 800° C., and the target temperature is in the range of from 800° C. to 1100° C.

Described above are preferred examples of the present disclosure. It should be noted that persons of ordinary skill in the art may derive other improvements without departing from the principles of the present disclosure. Such improvements shall be deemed as falling within the protection scope of the present disclosure.

What is claimed is:

1. A surface oxidation method for a wafer, the method comprises:

raising a temperature on the wafer disposed in an annealing furnace comprising a vertical furnace tube, wherein the temperature is raised in an oxidation atmosphere from a start temperature to a target temperature at a temperature raising rate greater than 5° C./min, wherein a first oxidation layer is formed on a surface of the wafer, wherein the formed first oxidation layer has a thickness that is greater at a center than at an edge, wherein the temperature is raised in the vertical furnace tube of the annealing furnace, wherein the vertical furnace tube includes a gas intake conduit arranged on a side wall, wherein the gas intake conduit includes a gas inlet arranged to be proximate to a bottom of the vertical furnace tube and a gas outlet arranged to be proximate to a top of the furnace tube, wherein the wafer overlying the vertical furnace tube; and isothermally oxidizing the wafer, wherein the isothermal oxidizing is performed at the target temperature in the oxidation atmosphere in the vertical furnace tube, wherein a second oxidation layer is further formed on the surface of the wafer, wherein the formed second oxidation layer has a thickness that is greater at a center than at an edge.

2. The method according to claim 1, wherein the temperature raising rate in the temperature raising step is in the range of 10° C./min to 15° C./min.

3. The method according to claim 1, wherein raising a temperature on the wafer comprises an atmosphere of hydrogen and oxygen, wherein a volume ratio of hydrogen to oxygen is in the range of 1:1 to 1.8:1.

4. The method according to claim 1, wherein isothermally oxidizing the wafer comprises an atmosphere of hydrogen and oxygen, wherein a volume ratio of hydrogen to oxygen is in the range of 1:1 to 1.8:1.

5. The method according to claim 1, wherein the start temperature is in the range of 400° C. to 800° C., and the target temperature is in the range of 800° C. to 1100° C.

* * * * *